(12) United States Patent
Lee et al.

(10) Patent No.: US 12,501,604 B2
(45) Date of Patent: Dec. 16, 2025

(54) MULTI-VALUED MEMORY DEVICE BASED ON NEGATIVE TRANSCONDUCTANCE USING MONOLITHIC WSe2 THIN FILM

(71) Applicant: RESEARCH & BUSINESS FOUNDATION SUNGKYUNKWAN UNIVERSITY, Suwon-si (KR)

(72) Inventors: Sungjoo Lee, Seongnam-si (KR); Hyeonje Son, Suwon-si (KR); Haeju Choi, Suwon-si (KR); Taeho Kang, Seoul (KR); Chanwoo Kang, Incheon (KR); Sungpyo Baek, Suwon-si (KR); Hyun Ho Yoo, Suncheon-si (KR); Jae Hyeok Ju, Changwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 519 days.

(21) Appl. No.: 17/976,234

(22) Filed: Oct. 28, 2022

(65) Prior Publication Data
US 2023/0140466 A1 May 4, 2023

(30) Foreign Application Priority Data
Oct. 28, 2021 (KR) .......................... 10-2021-0145161

(51) Int. Cl.
*H10B 12/00* (2023.01)
*H10D 48/36* (2025.01)
*H10D 62/80* (2025.01)

(52) U.S. Cl.
CPC ........... *H10B 12/20* (2023.02); *H10D 48/362* (2025.01); *H10D 62/80* (2025.01)

(58) Field of Classification Search
CPC ...... H10B 12/20; H10D 48/362; H10D 62/80; H10D 12/211; H10D 86/60; H10D 30/675;
(Continued)

(56) References Cited

U.S. PATENT DOCUMENTS

2016/0248007 A1* 8/2016 Hersam ................ H10N 70/823
2018/0004082 A1* 1/2018 Song ......................... G03F 1/62
(Continued)

FOREIGN PATENT DOCUMENTS

KR 10-2019-0012050 A 2/2019

OTHER PUBLICATIONS

Luo, Peng, et al. "Doping engineering and functionalization of two-dimensional metal chalcogenides." Nanoscale Horizons 4.1, 2018: (27 pages in English).

*Primary Examiner* — Norman D Richards
*Assistant Examiner* — Ethan Edward Cutler
(74) *Attorney, Agent, or Firm* — NSIP Law (57) ABSTRACT

Disclosed are a negative transconductance device and a multi-valued memory device using the same. The negative transconductance includes a monolithic WSe$_2$ semiconductor thin film; a first doped layer disposed on a first area of the WSe$_2$ semiconductor thin film; a second doped layer disposed on a second area of the WSe$_2$ semiconductor thin film so as to supply holes to the second area, wherein the second area is spaced apart from the first area; a first electrode electrically connected to the first area of the WSe$_2$ semiconductor thin film; a second electrode electrically connected to the second area of the WSe$_2$ semiconductor thin film; and a third electrode for applying a gate voltage to the first area and the second area of the WSe$_2$ semiconductor thin film, and to a third area thereof located between the first and second areas.

10 Claims, 4 Drawing Sheets

(58) Field of Classification Search
CPC ..... H10D 86/471; H01L 21/38; H01L 21/441; B82Y 10/00
See application file for complete search history.

(56) References Cited

U.S. PATENT DOCUMENTS

2018/0158934 A1\* 6/2018 Jonker ............... H10D 30/6757
2019/0097014 A1 3/2019 Lee et al.

\* cited by examiner

MULTI-VALUED MEMORY DEVICE BASED ON NEGATIVE TRANSCONDUCTANCE USING MONOLITHIC WSe2 THIN FILM

CROSS-REFERENCE TO RELATED APPLICATION

This application claims a benefit under 35 U.S.C § 119(a) of Korean Patent Application No. 10-2021-0145161 filed on Oct. 28, 2021, on the Korean Intellectual Property Office, the entire disclosure of which is incorporated herein by reference for all purposes.

BACKGROUND

1. Field

The present disclosure relates to a negative transconductance device in which an n-i-p $WSe_2$ double lateral homojunction (DLHJ) structure is implemented in a monolithic semiconductor thin film made of a single material such that the device has double negative differential transconductance (NDT), and to a multi-valued memory device using the same.

2. Description of Related Art

Recently, an electronic device is being scaled down and has increasingly higher integration. However, when the miniaturization and integration are improved using a binary element, there is a limitation in that power consumption increases and a signal delay problem occurs due to need of a larger number of binary elements.

In order to overcome the limitations of use of the binary elements, development of a multi-valued device having multiple logical states in a single device is in progress. When such a multi-valued device is applied, the number of integrated elements may be reduced, so that excessive power consumption and the signal delay problem may be solved.

In general, the multi-valued device may be implemented using a device having negative resistance or negative differential transconductance (NDT) having N threshold voltages. Researches are being conducted to implement a negative transconductance device using a conventional Si material, a 2D semiconductor material, or an organic semiconductor material, etc. However, there is a limitation in that it is difficult to stably implement a multi-valued device having at least three logical values because the number of a PVCR (peak-to-valley current ratio) is limited to 1 in a single device or the device has a low PVCR (peak-to-valley current ratio).

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a negative transconductance device in which n-i-p double lateral homojunction (DLHJ) is implemented in a $WSe_2$ semiconductor thin film made of a single semiconductor material via selective surface charge transfer doping, such that the device has double negative differential transconductance (NDT).

Another purpose of the present disclosure is to provide a multi-valued memory device using the negative transconductance device.

A first aspect of the present disclosure provides a negative transconductance device comprising: a monolithic $WSe_2$ semiconductor thin film; a first doped layer disposed on a first area of the $WSe_2$ semiconductor thin film so as to supply electrons to the first area; a second doped layer disposed on a second area of the $WSe_2$ semiconductor thin film so as to supply holes to the second area, wherein the second area is spaced apart from the first area; a first electrode electrically connected to the first area of the $WSe_2$ semiconductor thin film; a second electrode electrically connected to the second area of the $WSe_2$ semiconductor thin film; and a third electrode for applying a gate voltage to the first area and the second area of the $WSe_2$ semiconductor thin film, and to a third area thereof located between the first and second areas.

In one implementation of the negative transconductance device, the first doped layer includes $CH_3$ radicals, and the second doped layer includes $Au_2Cl_6$.

In one implementation of the negative transconductance device, a concentration of the $CH_3$ radicals is in a range of $1\times10^{11}$ cm$^{-2}$ to $1\times10^{13}$ cm$^{-2}$, and a concentration of the $Au_2Cl_6$ is in a range of $1\times10^1$ cm$^{-2}$ to $1\times10^{13}$ cm$^{-2}$.

In one implementation of the negative transconductance device, a poly(methyl methacrylate) (PMMA) coating layer is disposed on the third area of the $WSe_2$ semiconductor thin film.

In one implementation of the negative transconductance device, the device further comprises a semiconductor substrate, wherein an insulating film is coated on a surface of the semiconductor substrate, wherein the semiconductor substrate supports the $WSe_2$ semiconductor thin film, and functions as a gate electrode.

A second aspect of the present disclosure provides a multi-valued memory device comprising: a monolithic $WSe_2$ semiconductor thin film; a first doped layer disposed on a first area of the $WSe_2$ semiconductor thin film so as to supply electrons to the first area; a second doped layer disposed on a second area of the $WSe_2$ semiconductor thin film so as to supply holes to the second area, wherein the second area is spaced apart from the first area; a first electrode electrically connected to the first area of the $WSe_2$ semiconductor thin film; a second electrode electrically connected to the second area of the $WSe_2$ semiconductor thin film; and a third electrode for applying a gate voltage to the first area and the second area of the $WSe_2$ semiconductor thin film, and to a third area thereof located between the first and second areas.

In one implementation of the multi-valued memory device, the first doped layer includes $CH_3$ radicals, and the second doped layer includes $Au_2Cl_6$.

In one implementation of the multi-valued memory device, a concentration of the $CH_3$ radicals is in a range of $1\times10^{11}$ cm$^{-2}$ to $1\times10^{13}$ cm$^{-2}$, and a concentration of the $Au_2Cl_6$ is in a range of $1\times10^{11}$ cm$^{-2}$ to $1\times10^{13}$ cm$^{-2}$.

In one implementation of the multi-valued memory device, a poly(methyl methacrylate) (PMMA) coating layer is disposed on the third area of the $WSe_2$ semiconductor thin film.

In one implementation of the multi-valued memory device, the device further comprises a semiconductor substrate, wherein an insulating film is coated on a surface of the semiconductor substrate, wherein the semiconductor substrate supports the WSe$_2$ semiconductor thin film, and functions as a gate electrode.

According to the negative transconductance device and the multi-valued memory device using the same in accordance with the present disclosure, a higher PVCR value may be achieved via the charge transfer based on trap-assisted tunneling through traps formed in the junction interface inside the single monolithic device, compared to conventional a serial connection device using a wiring. Further, the multi-valued memory device in accordance with the present disclosure may have three or more stable logic states due to the higher PVCR value.

BRIEF DESCRIPTION OF DRAWINGS

(a) in FIG. 3 is a diagram showing characteristics of a transistor using each of n-WSe$_2$, i-WSe$_2$ and p-WSe$_2$ areas as a channel material ($V_D$=0.2 V). (b) in FIG. 3 shows transistor characteristics (solid black line) of n-i-p WSe$_2$ according to one embodiment of the present disclosure, and shows a calculated current (grey dot) generated in a series resistor combination (Numerical combination) of the n-WSe$_2$, i-WSe$_2$ and p-WSe$_2$ transistors corresponding to (a) of FIG. 3.

DETAILED DESCRIPTIONS

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the figures is turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

Figure 1:
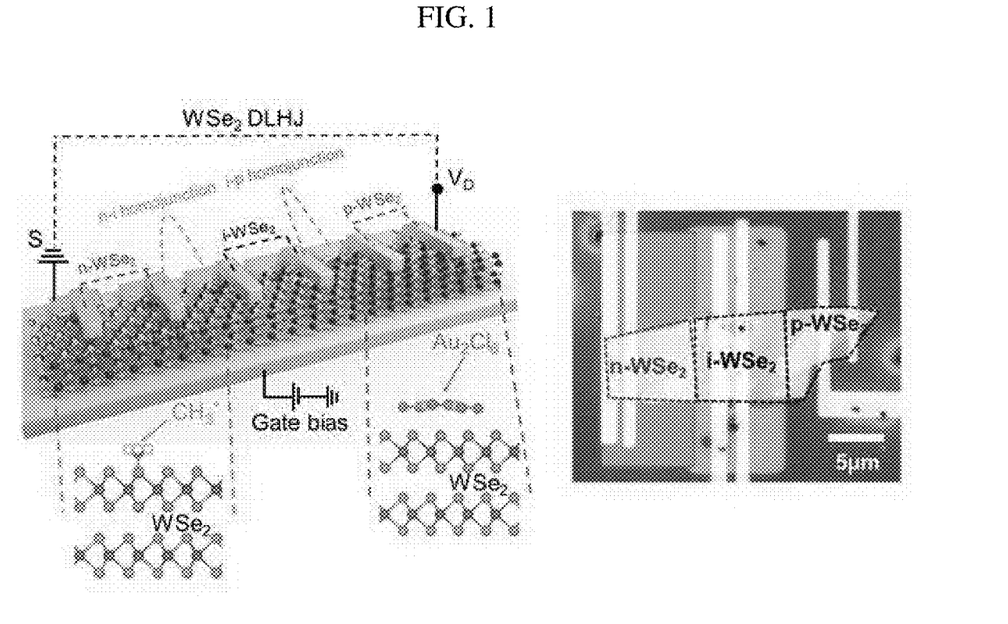
FIG. 1 is a diagram for illustrating a negative transconductance device according to one embodiment of the present disclosure.

FIG. 1 is a diagram for illustrating a negative transconductance device according to one embodiment of the present disclosure.

Referring to FIG. 1, a negative transconductance device according to an embodiment of the present disclosure includes a monolithic $WSe_2$ semiconductor thin film, a first doped layer disposed on the $WSe_2$ semiconductor thin film, a second doped layer disposed on the $WSe_2$ semiconductor thin film and spaced apart from the first doped layer, and first to third electrodes electrically connected to the $WSe_2$ semiconductor thin film.

The first doped layer may be disposed on a first area of the $WSe_2$ semiconductor thin film, and may supply electrons to the first area. Preferably, the first doped layer may include $CH_3$ radicals. The $CH_3$ radicals may act as an electron donor in the first doped layer. Preferably, a doping concentration of the $CH_3$ radicals may be in a range of $1\times10^{11}$ $cm^{-2}$ to $1\times10^{13}$ $cm^{-2}$ in the first area. An area (n-$WSe_2$) of the $WSe_2$ semiconductor thin film in which the first doped layer is formed may be used as an n-type semiconductor in accordance with the present disclosure.

The second doped layer may be disposed on a second area of the $WSe_2$ semiconductor thin film spaced apart from the first area, and may supply holes to the second area. The second doped layer may include $Au_2Cl_6$. $Au_2Cl_6$ may act as a hole donor in the second doped layer. Preferably, a doping concentration of $Au_2Cl_6$ may be in a range of $1\times10^{11}$ $cm^{-2}$ to $1\times10^{13}$ $cm^{-2}$ in the second area. An area (p-$WSe_2$) of the $WSe_2$ semiconductor thin film in which the second doped layer is formed may be used as a p-type semiconductor in accordance with the present disclosure.

Impurity doping may not be performed on a third area positioned between the first area and the second area of the $WSe_2$ semiconductor thin film. Accordingly, the area (i-$WSe_2$) of the $WSe_2$ semiconductor thin film including the third area may be used as an intrinsic semiconductor in accordance with the present disclosure. In one embodiment, a poly(methyl methacrylate) (PMMA) coating layer may be disposed on the third area. The PMMA coating layer does not affect doping onto the $WSe_2$ semiconductor thin film, and may be formed for spatial isolation between doped materials respectively disposed in the first and second areas disposed on left and right sides of the third area.

The negative transconductance device includes, for electrical connection, the first electrode electrically connected to the first area of the $WSe_2$ semiconductor thin film, a second electrode electrically connected to the second area of the $WSe_2$ semiconductor thin film, and a third electrode for applying a gate voltage to the first and second areas of the $WSe_2$ semiconductor thin film and the third area located therebetween. In other words, the third electrode may apply the gate voltage to all of the first to third areas. In one embodiment, the first electrode may act as a source electrode, the second electrode may act as a drain electrode, and the third electrode may act as a gate electrode.

In one embodiment, the negative transconductance device further includes a semiconductor substrate supporting the $WSe_2$ semiconductor thin film, wherein a surface of the substrate is coated with an insulating film. In this case, the semiconductor substrate may function as a gate electrode that applies the same gate voltage to the first to third areas simultaneously.

In the negative transconductance device according to the present disclosure, an n-i junction (a junction between an n-type semiconductor and an intrinsic semiconductor) and an i-p junction (a junction between an intrinsic semiconductor and a p-type semiconductor) is implanted in the $WSe_2$ semiconductor thin film made of a single material via selective surface charge transfer doping. Thus, double negative differential transconductance (NDT) may be implemented in one negative transconductance device via an n-i-p junction structure. Thus, the negative transconductance device according to the present disclosure may realize a higher PVCR value, compared to a conventional series combination.

Figure 2:
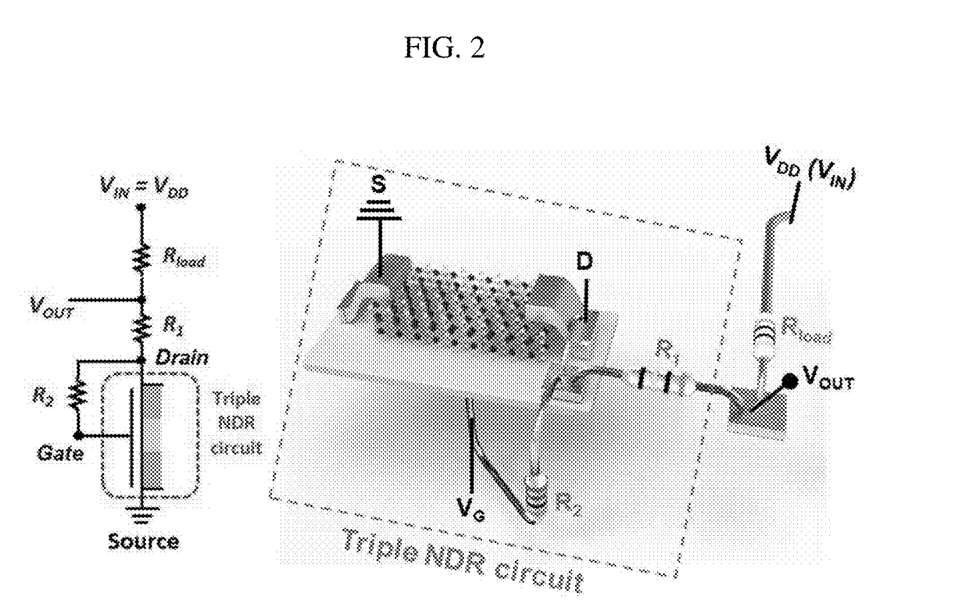
FIG. 2 is a diagram and a circuit diagram for illustrating a multi-valued memory device according to one embodiment of the present disclosure.

FIG. 2 is a diagram and a circuit diagram for illustrating a multi-valued memory device according to one embodiment of the present disclosure.

Referring to FIG. 2, the multi-valued memory device according to the present disclosure may include a monolithic $WSe_2$ semiconductor thin film, a first doped layer disposed on a first area of the $WSe_2$ semiconductor thin film so as to supply electrons to the first area, a second doped layer disposed on a second area of the $WSe_2$ semiconductor thin film spaced apart from the first area so as to supply holes to the second area, a first electrode electrically connected to the first area of the $WSe_2$ semiconductor thin film, a second electrode electrically connected to the second area of the $WSe_2$ semiconductor thin film, and a third electrode for applying a gate voltage to the first and second areas of the $WSe_2$ semiconductor thin film and to a third area thereof positioned therebetween.

The multi-valued memory device according to the present disclosure may further include an output electrode electrically connected to the second electrode and the third electrode.

Since a configuration of the multi-valued memory device is substantially the same as the configuration of the negative transconductance device as described with reference to FIG. 1, redundant detailed descriptions thereof are omitted, and following description is focused on differences therebetween.

In one embodiment, the multi-valued memory device may further include an input electrode ($V_{DD}=V_{IN}$). A voltage applied from the input electrode may be applied to the first electrode, the second electrode (VDS), and the third electrode (VG) according to a predetermined ratio via voltage distribution through resistors $R_{load}$, $R_1$, and $R_2$.

The multi-valued memory device may be implemented via correlated biasing to the negative transconductance device. Specifically, for correlated biasing of the second electrode and the third electrode, the output electrode electrically connected to the second electrode and the third electrode may be included in the multi-valued memory device. The multi-valued memory device may include a first resistor at a connection line between the output electrode and the second electrode and a second resistor at a connection line between the output electrode and the third electrode.

The multi-valued memory device according to the present disclosure utilizes the double negative differential transconductance (NDT) that occurs at the n-i and i-p homojunction interfaces inside the single semiconductor material due to a trap site formed via the selective doping, thereby stably implementing a quaternary inverter logic device.

Hereinafter, the negative transconductance device and the multi-valued memory device using the same according to the present disclosure will be described in more detail based on specific Present Examples and Comparative Examples. However, Examples of the present disclosure are only some examples of the present disclosure, and the scope of the present disclosure is not limited to the following Examples.

Present Example: Negative Transconductance Device ($WSe_2$ DLHJ)

FIG. 1 shows an overall schematic diagram of an n-i-p $WSe_2$ double lateral homojunction (DLHJ) device and an optical microscope image of an actually fabricated device.

Referring to FIG. 1, the negative transconductance device of Present Example 1 of the present disclosure was manufactured as follows. A two-dimensional semiconductor $WSe_2$ was formed on an insulator-coated silicon substrate ($Si_3N_4$ (40 nm)/$p^+$ doped Si) via a tape exfoliation, and an electrode (50 nm Au) was deposited thereon for device utilization. Thereafter, in order to develop an n-i-p $WSe_2$ DLHJ structure via the selective surface charge transfer doping, one side area of the $WSe_2$ film was coated with PMMA, and electron beams were irradiated to the PMMA except for the PMMA on the i-$WSe_2$ area as the intrinsic semiconductor area to generate an electron donor CH3* radical via a crosslinking process. That is, the electron doping was performed to coat the n-type semiconductor layer thereon. Then, PMMA containing $Au_2Cl_6$ as a hole donor was coated on the other side area of the $WSe_2$ film. That is, the hole doping was performed to coat the p-type semiconductor layer thereon. In Present Example 1, the negative transconductance device ($WSe_2$ DLHJ) having the n-i-p double lateral homojunction (DLHJ) structure including the n-type semiconductor area (n-$WSe_2$), the intrinsic semiconductor area (i-$WSe_2$) and the p-type semiconductor area (p-$WSe_2$), and including the n-i and i-p junction interfaces was manufactured.

Experimental Example 1: Analysis of PVCR of Negative Transconductance Device

In order to investigate the characteristics of the $WSe_2$ DLHJ according to one embodiment of the present disclosure, the PVCR value was measured. The results are shown in FIG. 3.

Figure 3:
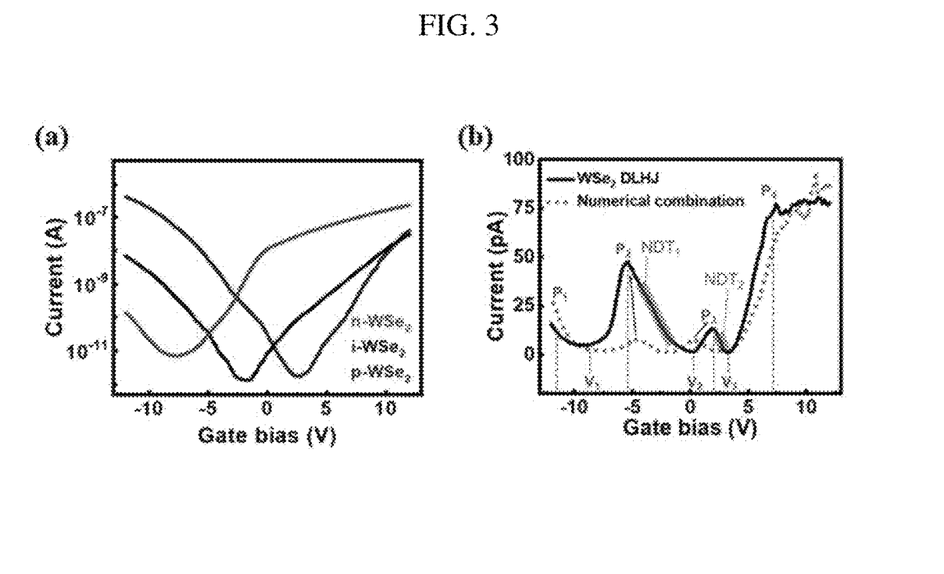

(a) in FIG. 3 is a diagram showing characteristics of a transistor using each of n-$WSe_2$, i-$WSe_2$ and p-$WSe_2$ areas as a channel material ($V_D=0.2$ V). (b) in FIG. 3 shows transistor characteristics (solid black line) of n-i-p $WSe_2$ according to one embodiment of the present disclosure, and shows a calculated current (grey dot) generated in a series resistor combination (Numerical combination) of the n-$WSe_2$, i-$WSe_2$ and p-$WSe_2$ transistors corresponding to (a) of FIG. 3. That is, the former (solid black line) represents a current value including the influences due to the n-i and i-p $WSe_2$ junction interfaces, and the latter (gray dot) represents a current value excluding all the influences due to the n-i and i-p $WSe_2$ junction interfaces.

Referring to (a) in FIG. 3, it may be identified that a charge neutral point of i-$WSe_2$ shifts to a negative gate voltage (n-$WSe_2$) after the electron doping and shifts to a positive gate voltage (p-$WSe_2$) after the hole doping.

Referring to (b) in FIG. 3, it may be identified that each of the $WSe_2$ DLHJ according to the present disclosure and the conventional device having the serial resistor combination (Numerical combination) exhibits the double NDT characterized by four peak currents ($P_1$ to $P_4$) and three valley currents ($V_1$ to $V_3$), whereas the PVCR values of the n-i-p $WSe_2$ DLHJ in accordance with the present disclosure are 36.6 ($P_2/V_2$) in $NDT_1$ and 12.9 ($P_3/V_3$) in $NDT_2$ which are higher than the PVCR values of the series resistor combination (6.05 and 4.34, respectively).

Figure 4:
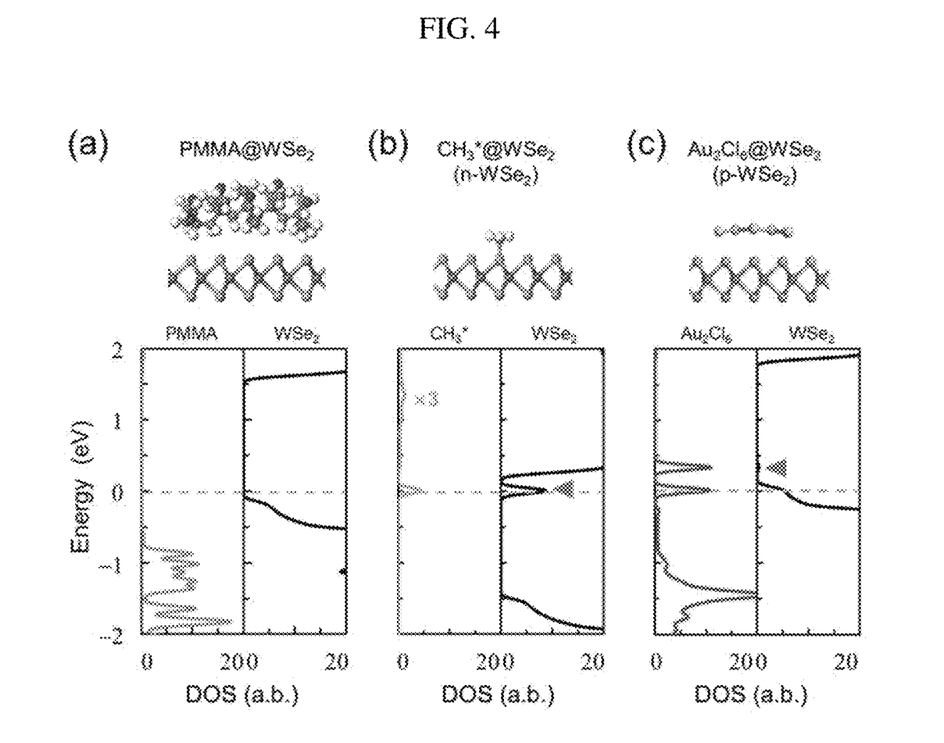
FIG. 4 is a diagram analyzing a WSe$_2$ surface charge transfer doping mechanism via density functional theory (DFT) calculation of WSe$_2$ DLHJ of one embodiment of the present disclosure. An optimized structure (upper panel) of each of (a) PMMA pentamer, (b) CH$_3$* radical and (c) Au$_2$Cl$_6$ molecule bound to a WSe$_2$ surface and respective corresponding DFTs (lower panel) are shown.

Experimental Example 2: Analysis of $WSe_2$ Surface Charge Transfer Doping Mechanism Via DFT Calculation FIG. 4 is a diagram analyzing a $WSe_2$ surface charge transfer doping mechanism via density functional theory (DFT) calculation of $WSe_2$ DLHJ of one embodiment of the present disclosure. An optimized structure (upper panel) of each of (a) PMMA pentamer, (b) $CH_3^*$ radical and (c) $Au_2Cl_6$ molecule bound to a $WSe_2$ surface and respective corresponding DFTs (lower panel) are shown in FIG. 4.

Referring to FIG. 4, it may be identified that when the $CH_3^*$ radical of (b) is adjacent to the surface, the energy band of $WSe_2$ is lowered compared with (a) before the doping, such the electron doping is achieved. It may be identified that when the $Au_2Cl_6$ molecule of (c) is adjacent to the surface, the energy band of $WSe_2$ shifts upward compared with (a) before the doping, such that the hole doping occurs. Further, it may be identified that a trap state (indicated by a gray triangle) is formed between bandgaps of $WSe_2$ in both of the electron doping and the hole doping.

The e-beam radiation (>5000 $\mu C\ cm^{-2}$) is irradiated to the PMMA coated on the surface of the $WSe_2$ semiconductor thin film such that the cross-linking process of PMMA occurs and $CH_3^*$ radical molecules are produced at the same time. The $CH_3^*$ radicals are capable of chemisorption with Se atoms. Specifically, the $CH_3^*$ radical having an unstable lone unpaired electron is combined with an electron of Se via hybridization. The $CH_3^*$ radicals adsorbed on a top surface of the $WSe_2$ semiconductor thin film may cause an electron doping effect (surface charge transfer doping). Further, a trap state with a higher density than that which $Au_2Cl_6$ which provides the hole doping effect via physisorption achieves is formed.

An energy level of the trap site has a value in a certain range as shown in the graph of FIG. 4. However, regarding the $CH_3^*$ radical, the highest density is achieved at a level lower by 0.15 eV than the $WSe_2$ conduction band edge, while regarding the $Au_2Cl_6$, the highest density is achieved at a level higher by 0.2 eV than the $WSe_2$ valence band edge.

Experimental Example 3: Analysis of Built-In Potential Barriers of n-i and i-p $WSe_2$ Junctions Based on Applied Gate Voltage Via KPFM Measurement To analyze a band offset of the n-i and i-p $WSe_2$ junctions based on the gate voltage of the negative transconductance device according to the present disclosure, KPFM (Kelvin Probe Force Microscope) measurement was performed. The results are shown in FIG. 5.

Figure 5:
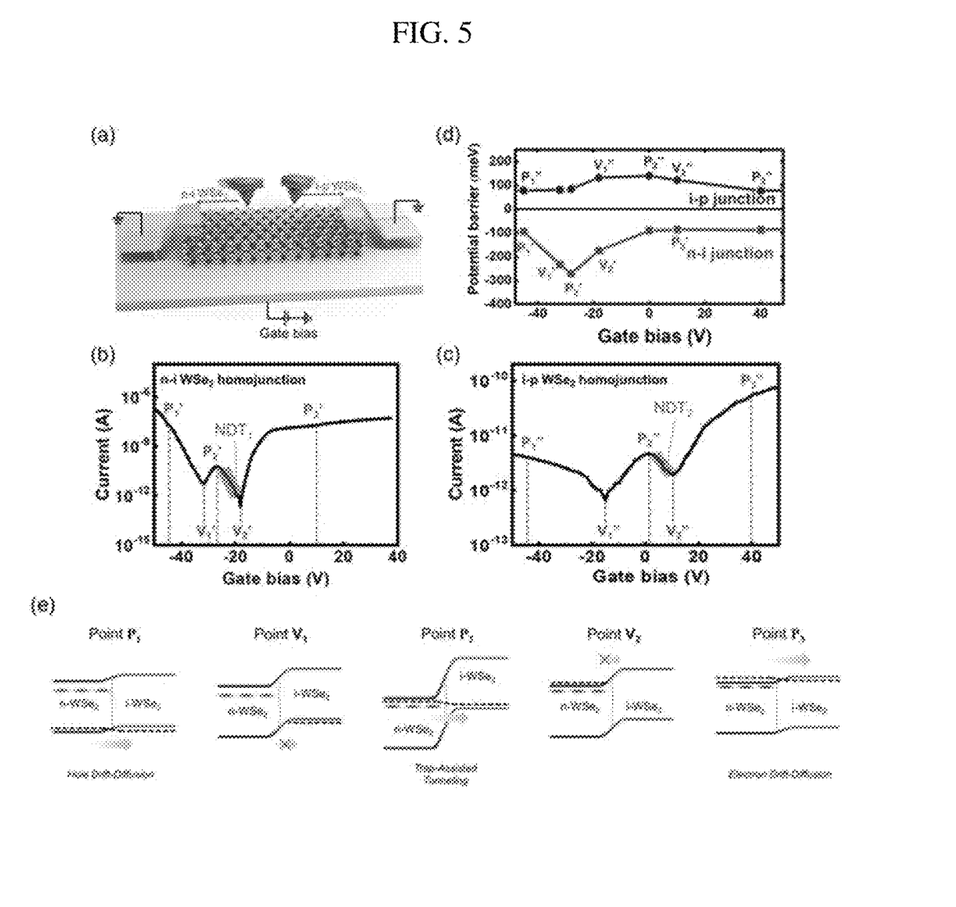
FIG. 5 shows (a) a schematic diagram of a KPFM measurement method according to the present disclosure, (b) transistor characteristics of n-i WSe$_2$ junction, (c) transistor characteristics of i-p WSe$_2$ junction, (d) a built-in potential barrier value based on a gate voltage of each of the n-i WSe$_2$ junction and the i-p WSe$_2$ junction, and (e) a band diagram based on the gate voltage of the n-i WSe$_2$ junction drawn based on DOS analysis via the DFT calculation and the built-in potential barrier calculation result via the KFPM measurement.

FIG. 5 shows (a) a schematic diagram of a KPFM measurement method according to the present disclosure, (b) transistor characteristics of n-i $WSe_2$ junction, (c) transistor characteristics of i-p $WSe_2$ junction, (d) a built-in potential barrier value based on a gate voltage of each of the n-i $WSe_2$ junction and the i-p $WSe_2$ junction, and (e) a band diagram based on the gate voltage of the n-i $WSe_2$ junction drawn based on DOS analysis via the DFT calculation and the built-in potential barrier calculation result via the KFPM measurement.

(a) in FIG. 5 is a schematic diagram of the KPFM measurement method. Using the KPFM measurement, a work function value of each of the n-$WSe_2$, i-$WSe_2$, and p-$WSe_2$ based on the gate voltage may be obtained. The built-in potential barrier may be calculated based on a difference between the work function values.

(b) and (c) in FIG. 5 respectively show the transistor characteristics of the n-i and i-p $WSe_2$ junctions as measured before the KPFM experiment. It may be identified that the double NDT of the n-i-p $WSe_2$ DLHJ device is derived from each of the n-i and i-p $WSe_2$ junctions.

(d) in FIG. 5 is a graph listing the built-in potential barrier values based on the gate voltage of the n-i and i-p $WSe_2$ junctions, respectively. It may be identified that in both junctions, the built-in potential barrier values are respectively maximum in the NDT peak current areas ($P_2'$ and $P_2''$).

(e) in FIG. 5 is a graph showing the band diagram based on the gate voltage of the n-i $WSe_2$ junction. When the gate voltage is at point $P_1$, the valence band maximums of the n-$WSe_2$ and i-$WSe_2$ are initially aligned with each other at the Fermi level, so that the hole drift-diffusion current dominates across an entirety of the junction. On the other hand, when the gate voltage is at point $V_1$, the current decreases in response to gate control to reduce the amount of holes in the n-$WSe_2$. When the gate voltage reaches a point $P_2$, the energy levels of the trap state inside n-$WSe_2$ and the valence band maximum of i-$WSe_2$ are aligned with each other, and energy loss of electrons is reduced via an inelastic tunneling process across the interface, resulting in improved trap-assisted tunneling. This may clarify the origin of the enhanced NDT peak current in (b) in FIG. 3. Then, when the gate voltage further increases and reaches a point $V_2$, the current decreases in response to the gate control to reduce the amount of holes in i-$WSe_2$. Finally, when the gate voltage is at point $P_3$, the conduction band minimums of n-$WSe_2$ and i-$WSe_2$ are aligned with each other at the Fermi level, so that electron drift-diffusion current becomes dominant across the entirety of the junction.

Similarly, the mechanism as described above may be applied to the band diagram based on the gate voltage of the i-p $WSe_2$ junction. Thus, it may be identified that the PVCR value of the NDT of the n-i-p $WSe_2$ DLHJ device according to the present disclosure is improved due to the trap-assisted tunneling occurring at the interface of the homojunction.

Example 4: Implementation of Quaternary Latch Circuit Via Correlated Biasing of Drain and Gate Terminals of n-i-p $WSe_2$ DLHJ Device FIG. 6 shows (a) a schematic diagram and a circuit configuration of a quaternary latch composed of a triple NDR circuit that may be implemented via correlated biasing of drain and gate terminals of the $WSe_2$ DLHJ device, (b) a triple NDR I-V curve (solid black line) optimized under $V_{DD}$=6.5 V and a load line (blue dot) of a resistor ($R_{load}$=400 G$\Omega$), and (c) an input (black line)/output (red line) signal waveform of a quaternary latch circuit based on the $WSe_2$ DLHJ device and a circuit configuration thereof.

Figure 6:
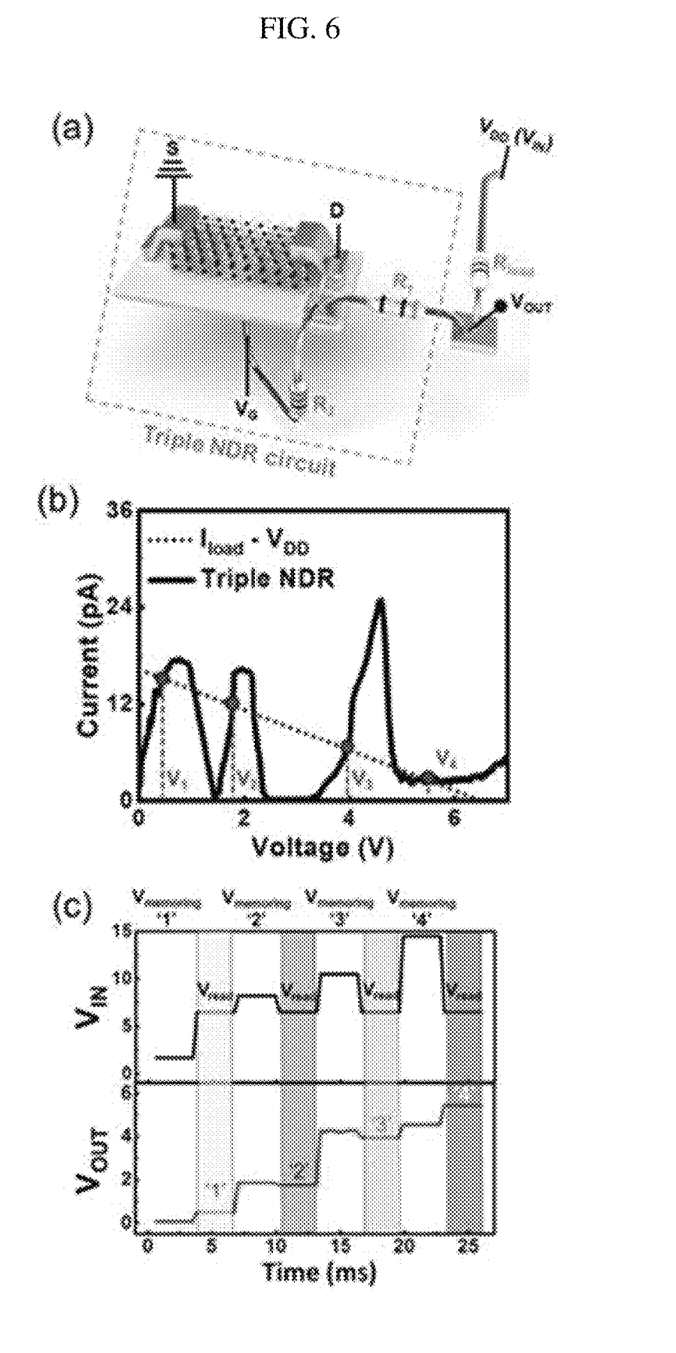
FIG. 6 shows (a) a schematic diagram and a circuit configuration of a quaternary latch composed of a triple NDR circuit that may be implemented via correlated biasing of drain and gate terminals of the WSe$_2$ DLHJ device, (b) a triple NDR I-V curve (solid black line) optimized under $V_{DD}$=6.5 V and a load line (blue dot) of a resistor ($R_{load}$=400 GΩ), and (c) an input (black line)/output (red line) signal waveform of a quaternary latch circuit based on the WSe$_2$ DLHJ device and a circuit configuration thereof.

Referring to (a) in FIG. 6, in order to obtain a triple NDR circuit, the drain and gate biases of the $WSe_2$ DLHJ device are simultaneously controlled via correlated biasing by applying bias generating resistors thereto ($R_1$ for the drain and $R_2$ for the gate). For the correlated biasing of the drain and gate terminals, a first resistor $R_1$ is connected in series to and disposed between the drain electrode and the output electrode, and the first resistor $R_1$ and a second resistor $R_2$ are connected in series to and disposed between the gate electrode and the output electrode. A voltage across the triple NDR circuit is the same as an output voltage of the output electrode, and a drain voltage and a gate voltage applied to the negative transconductance are determined based on a ratio of a resistance of the first resistor $R_1$ and a resistance of the second resistor $R_2$. In this example, $R_1:R_2=1:3$. A load resistor $R_{load}$ is connected in series to and disposed between the output electrode $V_{out}$ and the input electrode $V_{IN}$. In this example, a resistance value of the load resistor is $R_{load}=400$ GΩ.

Referring to (b) in FIG. 6, it may be identified that the blue dots intersect a positive differential resistor area of the NDR I-V curve to form four distinct operating states ($V_1=0.48$ V, $V_2=1.76$ V, $V_3=3.94$ V, and $V_4=5.44$V).

Referring to (c) in FIG. 6, when $V_{IN}$ is set to 6.5 V (=$V_{read}$), $V_{OUT}$ may be one of the four stable state voltages $V_1$, $V_2$, $V_3$ and $V_4$ depending on a previous write operation. To change a storage state represented by $V_{OUT}$, $V_{IN}$ should be applied as a specific voltage and then return the same to $V_{read}$. In an example, when the input voltage $V_{IN}$ is applied as 1.7 V ($V_{memoring}$ '1') for 0 to 4 ms and then increases to $V_{read}$ for 4 to 7 ms, the output voltage has a first steady-state voltage ($V_1=0.48$ V). Similarly, when $V_{IN}$ is applied to 8.2/10.5/14.5 V and then returns to $V_{read}$, the output voltage $V_{OUT}$ has corresponding respective stable logic states $V_2/V_3/V_4$ for 10 to 13, 16 to 19, and 23 to 26 ms. Therefore, it may be identified that four logic states may be provided.

Based on the Present Examples and Experimental Examples, it may be identified that in the negative transconductance device according to the present disclosure, the trap-assisted tunneling via the trap state at the n-i and i-p $WSe_2$ junction interfaces through the trap site formed after the selective doping occurs. Accordingly, the peak current of the NDT increases, such that the negative transconductance device according to the present disclosure has a higher PVCR than that in the prior art. Further, it may be identified that in implementing the multi-valued memory device using the n-i-p $WSe_2$ DLHJ device according to the present disclosure, a stable quaternary memory operation is realized.

The descriptions of the presented embodiments have been provided so that a person of ordinary skill in the art of any the present disclosure may use or practice the present disclosure. Various modifications to these embodiments will be apparent to those skilled in the art of the present disclosure, and the general principles defined herein may be applied to other embodiments without departing from the scope of the present disclosure. Thus, the present disclosure is not intended to be limited to the embodiments presented herein, but is to be construed in the widest scope consistent with the principles and novel features presented herein.

What is claimed is:

1. A negative transconductance device comprising:
a monolithic $WSe_2$ semiconductor thin film forming a continuous channel layer;
a first chemically doped layer formed in a first area of the $WSe_2$ semiconductor thin film, the first doped region configured to supply electrons to the first area;
a second chemically doped layer formed in a second area of the $WSe_2$ semiconductor thin film, the second doped region configured to supply holes to the second area, wherein the second area is spaced apart from the first area along a lateral direction of the $WSe_2$ semiconductor thin film;
a third area of the $WSe_2$ semiconductor thin film disposed between the first and second areas and remaining substantially intrinsic or undoped;
a first electrode electrically connected to the first area of the $WSe_2$ semiconductor thin film;
a second electrode electrically connected to the second area of the $WSe_2$ semiconductor thin film; and
a third electrode configured to apply a gate voltage simultaneously to the first area, the second area, and the third area to induce ambipolar carrier transport and generate negative transconductance behavior.

2. The negative transconductance device of claim 1, wherein the first chemically doped layer comprises $CH_3$ radicals as n-type dopants, and the second chemically doped layer comprises $Au_2Cl_6$ as p-type dopants.

3. The negative transconductance device of claim 2, wherein a concentration of the $CH_3$ radicals in the first area is in a range of $1\times10^{11}$ cm$^{-2}$ to $1\times10^{13}$ cm$^{-2}$, and wherein a concentration of the $Au_2Cl_6$ in the second area is in a range of $1\times10^{11}$ cm$^{-2}$ to $1\times10^{13}$ cm$^{-2}$.

4. The negative transconductance device of claim 1, wherein a poly (methyl methacrylate) (PMMA) coating layer is disposed on the third area of the $WSe_2$ semiconductor thin film to suppress unintentional doping and stabilize the intrinsic electrical properties of the third area.

5. The negative transconductance device of claim 1, wherein the device further comprises:
a semiconductor substrate; and
an insulating film disposed on a surface of the semiconductor substrate,
wherein the $WSe_2$ semiconductor thin film is supported by the insulating film, and
wherein the semiconductor substrate functions as a global back gate for applying the gate voltage to the first, second, and third areas of the $WSe_2$ semiconductor thin film.

6. A multi-valued memory device comprising:
a monolithic $WSe_2$ semiconductor thin film forming a continuous channel layer;
a first chemically doped layer disposed in a first area of the $WSe_2$ semiconductor thin film and configured to supply electrons to the first area;
a second chemically doped layer disposed in a second area of the $WSe_2$ semiconductor thin film and configured to supply holes to the second area, wherein the second area is laterally spaced apart from the first area;
a third area of the $WSe_2$ semiconductor thin film disposed between the first and second areas and having an intrinsic or undoped carrier profile;
a first electrode electrically connected to the first area of the $WSe_2$ semiconductor thin film;
a second electrode electrically connected to the second area of the $WSe_2$ semiconductor thin film; and
a third electrode configured to apply a gate voltage to the first, second, and third areas of the $WSe_2$ semiconductor thin film,
wherein the device is configured to exhibit multiple stable current levels at the second electrode in response to different gate voltages applied to the third electrode, such that each current level represents a distinct logic state.

7. The multi-valued memory device of claim 6, wherein the first chemically doped layer includes $CH_3$ radicals as n-type dopants, and the second chemically doped layer includes $Au_2Cl_6$ as p-type dopants.

8. The multi-valued memory device of claim 7, wherein the $CH_3$ radicals are present at a concentration in a range of $1\times10^{11}$ cm$^{-2}$ to $1\times10^{13}$ cm$^{-2}$, and wherein the $Au_2Cl_6$ is present at a concentration in a range of $1\times10^{11}$ cm$^{-2}$ to $1\times10^{13}$ cm$^{-2}$.

9. The multi-valued memory device of claim 6, wherein a poly (methyl methacrylate) (PMMA) coating layer is disposed on the third area of the $WSe_2$ semiconductor thin film to suppress unintentional doping and stabilize the intrinsic electrical properties of the third region.

10. The multi-valued memory device of claim 6, wherein the device further comprises:
- a semiconductor substrate; and
- an insulating film disposed on a surface of the semiconductor substrate, wherein the $WSe_2$ semiconductor thin film is supported by the insulating film, and wherein the semiconductor substrate functions as a global back gate for applying the gate voltage to the first, second, and third areas of the $WSe_2$ semiconductor thin film.

* * * * *